(12) United States Patent
Shen (10) Patent No.: US 9,806,061 B2
(45) Date of Patent: Oct. 31, 2017

(54) BUMPLESS WAFER LEVEL FAN-OUT PACKAGE

(71) Applicant: Altera Corporation, San Jose, CA (US)

(72) Inventor: Minghao Shen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/087,907

(22) Filed: Mar. 31, 2016

(65) Prior Publication Data

US 2017/0287872 A1    Oct. 5, 2017

(51) Int. Cl.
| | |
|---|---|
| H01L 21/48 | (2006.01) |
| H01L 21/56 | (2006.01) |
| H01L 23/14 | (2006.01) |
| H01L 23/31 | (2006.01) |
| H01L 23/367 | (2006.01) |
| H01L 23/495 | (2006.01) |
| H01L 25/00 | (2006.01) |
| H01L 25/065 | (2006.01) |

(52) U.S. Cl.
CPC ...... *H01L 25/0655* (2013.01); *H01L 21/4839* (2013.01); *H01L 21/4882* (2013.01); *H01L 21/565* (2013.01); *H01L 23/142* (2013.01); *H01L 23/3157* (2013.01); *H01L 23/367* (2013.01); *H01L 23/49506* (2013.01); *H01L 23/49562* (2013.01); *H01L 25/50* (2013.01)

(58) Field of Classification Search
CPC ......... H01L 25/00; H01L 23/12; H01L 23/14; H01L 23/145; H01L 23/31; H01L 23/28; H01L 21/4803; H01L 21/50; H01L 21/52; H01L 2224/80895; H01L 2224/81895
See application file for complete search history.

(56) References Cited

U.S. PATENT DOCUMENTS

| | | | | |
|---|---|---|---|---|
| 6,084,308 A | * | 7/2000 | Kelkar | H01L 21/563 257/693 |
| 6,659,512 B1 | * | 12/2003 | Harper | H01L 25/0657 257/777 |
| 6,873,040 B2 | * | 3/2005 | Howard | H01L 23/13 257/691 |
| 6,952,049 B1 | * | 10/2005 | Ogawa | H01G 4/232 257/678 |

(Continued)

OTHER PUBLICATIONS

PCT/US2017/017486 International Search Report and Written Opinion dated May 19, 2017.

*Primary Examiner* — Peniel M Gumedzoe
(74) *Attorney, Agent, or Firm* — Fletcher Yoder, P.C.

(57) ABSTRACT

An integrated circuit package may include a first conductive pad on an interposer substrate, and a second conductive pad formed on a front surface of an integrated circuit die. The second conductive pad may directly contact the first conductive pad on the interposer substrate. The integrated circuit package may further include a package substrate having a cavity, in which the interposer substrate and the integrated circuit are disposed in the cavity. The interposer substrate may include interconnect pathways that are electrically coupled to the first and second conductive pads. A heat spreader may subsequently form over the integrated circuit die and the package substrate.

20 Claims, 7 Drawing Sheets

(56) References Cited

U.S. PATENT DOCUMENTS

| | | | |
|---|---|---|---|
| 7,036,218 B2* | 5/2006 | Pierce | G01R 1/0433 257/668 |
| 7,170,183 B1* | 1/2007 | Kim | H01L 23/49575 257/685 |
| 8,310,063 B2* | 11/2012 | Wang | H01L 21/563 257/777 |
| 8,335,084 B2 | 12/2012 | Lee et al. | |
| 9,627,285 B2 | 4/2017 | Hu | |
| 2004/0183187 A1* | 9/2004 | Yamasaki | H01L 21/76898 257/700 |
| 2005/0017347 A1* | 1/2005 | Morimoto | H05K 1/186 257/703 |
| 2006/0258120 A1* | 11/2006 | Gilroy | H01L 24/81 438/455 |
| 2007/0007641 A1 | 1/2007 | Lee et al. | |
| 2007/0069352 A1 | 3/2007 | Ho et al. | |
| 2009/0032926 A1* | 2/2009 | Sharifi | H01L 23/13 257/686 |
| 2009/0145636 A1* | 6/2009 | Miki | H01L 21/6835 174/255 |
| 2010/0081236 A1 | 4/2010 | Yang et al. | |
| 2012/0081864 A1* | 4/2012 | Sakurai | H01L 23/49822 361/753 |
| 2012/0268155 A1* | 10/2012 | Rathburn | G01R 31/2889 324/756.02 |
| 2013/0032390 A1* | 2/2013 | Hu | H01L 23/147 174/266 |
| 2014/0048326 A1* | 2/2014 | Lin | H05K 9/00 174/377 |
| 2014/0048951 A1* | 2/2014 | Lin | H01L 23/481 257/774 |
| 2014/0145328 A1* | 5/2014 | Tummala | H01L 24/05 257/737 |

* cited by examiner

BUMPLESS WAFER LEVEL FAN-OUT PACKAGE

BACKGROUND

This disclosure relates generally to integrated circuits and, more particularly, to a bumpless wafer level fan-out package for one or more integrated circuits.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

A flip chip semiconductor device refers to a package-less semiconductor device which may be mounted to a substrate, such as a printed circuit board (PCB), in a die-down or chip-down position. In other words, an active surface of an integrated circuit die (or semiconductor die) which is a component of the device will be facing the substrate. Typically, a flip chip device is mounted to a substrate by forming a plurality of conductive bumps, for example solder bumps, on an active surface of an integrated circuit die and electrically coupling these bumps to corresponding bond pads on a substrate, such as an interposer substrate.

However, flip chip packages for a bumped integrated circuit die employing an interposer substrate may be undesirably thick due to the combined height of the integrated circuit die and interposer substrate. The structure of such packages is typically complicated, which may result in high assembly cost and low manufacturing yield. Additionally, such packages may also result in production inefficiencies, such as pitch mismatch or discontinuity, due to low routing capacity and degraded signal integrity.

SUMMARY

In accordance with the present disclosure, apparatuses and methods are provided for creating a bumpless wafer level fan-out package. The present disclosure can be implemented in numerous ways, such as a process, an apparatus, a system, or a device. Several inventive embodiments of the present disclosure are described below.

An integrated circuit package is disclosed. The integrated circuit package includes a first conductive pad on an interposer substrate, and a second conductive pad formed on a front surface of an integrated circuit die. The second conductive pad directly contacts the first conductive pad on the interposer substrate. The integrated circuit package further includes a package substrate having a cavity, in which the interposer substrate and the integrated circuit are disposed in the cavity. The interposer substrate may include interconnect pathways that are electrically coupled to the first and second conductive pads. A heat spreader is subsequently formed over the integrated circuit die and the package substrate.

Another integrated circuit package is disclosed. The integrated circuit package includes an interposer substrate having a surface and an integrated circuit die having front and back surfaces. A group of conductive pads is formed on the surface of the interposer substrate. The integrated circuit die is mounted on the interposer substrate, where the front surface of the integrated circuit die faces the interposer substrate. A group of contact pads is formed on the front surface of the integrated circuit die. Each contact pad makes direct physical contact with a corresponding conductive pad in the group of conductive pads. A package substrate may surround the interposer substrate and the integrated circuit die. The integrated circuit package may further include an additional integrated circuit die that is mounted on the interposer substrate. The additional integrated circuit die may be connected to the integrated circuit die through a group of interconnect pathways of the interposer substrate.

A method of fabricating an integrated circuit package is disclosed. The method includes forming a first group of conductive pads on an interposer substrate, and a second group of conductive pads on an integrated circuit die. The integrated circuit die is then assembled on the interposer substrate so that each conductive pad in the second group of conductive pads makes direct physical contact with a corresponding conductive pad in the first group of conductive pads. The method further includes embedding the integrated circuit die and the interposer substrate in a package substrate to form the integrated circuit package. If desired, an additional integrated circuit die may be assembled on the interposer substrate. The additional integrated circuit may couple to the integrated circuit die through a group of interconnect pathways in the interposer substrate.

Refinements or combinations of the features noted above may be used in various embodiments of the present disclosure. For instance, various features discussed below in relation to the illustrated embodiments may be incorporated into above-described aspects alone or in some combination. The brief summary presented above is intended only to familiarize the reader with certain aspects and contexts of embodiments of the present disclosure without limitation to the claimed subject matter. Further features of the disclosure, its nature and various advantages, will be more apparent from the accompanying drawings and the following detailed description.

DETAILED DESCRIPTION

The embodiments provided herein include integrated circuit structures and packaging techniques for creating a bumpless wafer level fan-out package. The embodiments may be practiced without some or all of these specific details described with reference to the respective embodiments. In other instances, well-known operations have not been described in detail in order not to obscure unnecessarily the present embodiments.

Figure 1:
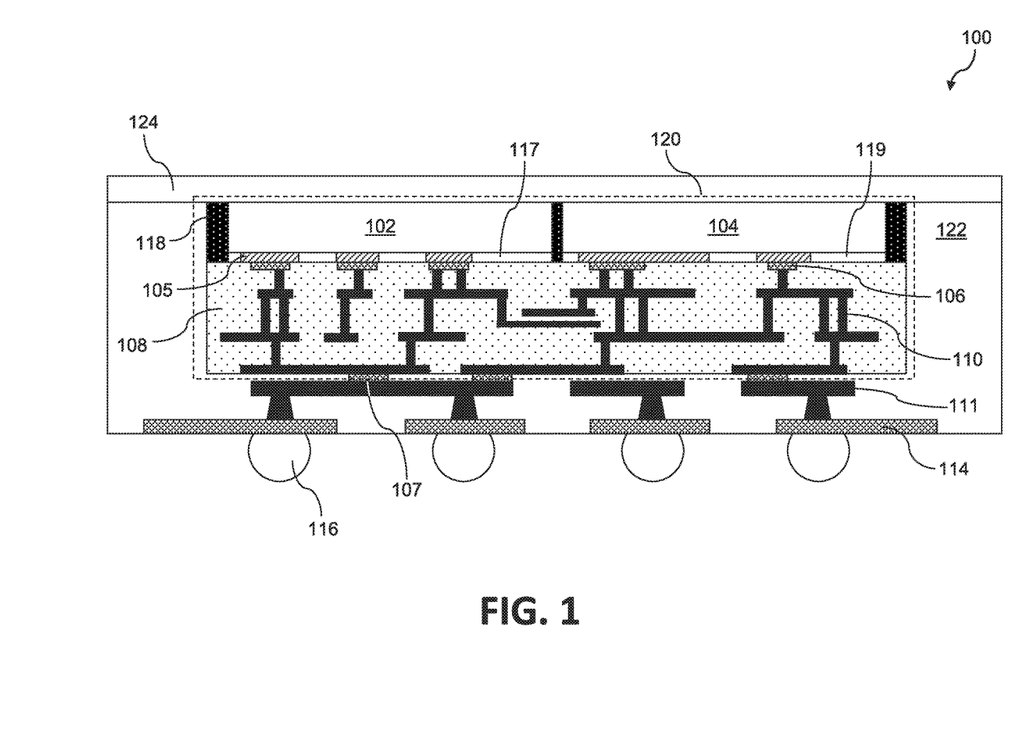
FIG. 1 shows a cross-sectional view of an illustrative integrated circuit package having two integrated circuit dies in accordance with one embodiment.

FIG. 1 shows a cross-sectional view of illustrative integrated circuit package 100 having two integrated circuit dies in accordance with one embodiment. Integrated circuit (IC) package 100 includes IC dies 102 and 104, which are positioned adjacent to each other. As used herein, the term "adjacent" means "next to," laterally adjacent, or immediately adjacent. Two immediately adjacent items (e.g., IC dies 102 and 104) may or may not be in contact with each other, but there is no other item of the same kind (e.g., another IC die) that is interposed between the adjacent items. In one embodiment, IC dies 102 and 104 may be flip-chip dies. Accordingly, conductive pads 105 (or contact pads 105) are disposed on the front surfaces (e.g., surfaces 117 and 119) of IC dies 102 and 104.

Molding compound 118 may surround IC dies 102 and 104. The molded IC dies 102 and 104 are mounted on an interposer substrate (e.g., interposer substrate 108). In one embodiment, IC dies 102 and 104 may form electrical connections with interposer substrate 108 via direct coupling of conductive pads 105 to their respective conductive pads 106. Such a configuration is conducted without any intervening bumps (i.e., solder bumps), which eliminates or reduces the risk of bump shorting between the conductive pads. As shown in FIG. 1, interposer substrate 108 may include one or more interconnect pathways (e.g., metal traces 110) that are electrically coupled to conductive pads 106 to form electrical connections. For example, metal traces 110 may be copper traces. In one embodiment, metal traces 110 may be formed in a fan-out arrangement to create an intra-package chip-to-chip connection for signal transmissions between IC die 102 and IC die 104. As an example, input-output (IO) signals from IC die 102 can be routed to IC die 104 via the chip-to-chip connection.

With the increasing demands for high-density integrated circuit packages, a bumpless attachment method may be used in the fabrication of such packages to address the desire for improved signal integrity. For example, as shown in FIG. 1, IC dies 102 and 104 may form electrical connections with interposer substrate 108 via direct coupling of conductive pads 105 to their respective conductive pads 106 on interposer substrate 108. For example, the direct coupling of conductive pads 105 and conductive pads 106 may be formed through a direct cold welding process or a covalence bond assist diffusion bonding process, but is not limited thereto. It should be noted that, in one embodiment, no solder is used to attach conductive pads 105 to the conductive pads 106. As such, a high-density interconnection structure may be achieved because bump bridging does not occur in the bumpless process. Hence, the conductive pads can be placed close to each other at very fine pitch (e.g., less than 2 micrometers).

In one embodiment, IC dies 102 and 104, molding compound 118, and interposer substrate 108 may be referred to as a wafer-level fan-out (WLFO) structure (e.g., WLFO structure 120). WLFO structure 120 is embedded into package substrate 122, such that a compact and thin IC package is formed. In one embodiment, package substrate 122 may be an organic substrate. As shown in FIG. 1, package substrate 122 includes metal traces 111 that are electrically coupled to interposer substrate 108 of IC package 100 through conductive pads 107. Solder balls 116, disposed on conductive pads 114 on the bottom surface of package substrate 122, may provide electrical communication from IC package 100 to a printed circuit substrate (not shown), which may also host other circuits. For example, solder balls 116 may be part of a ball grid array. A more detailed description of package substrate 122 and WLFO structure 120 will be described in detail later with reference to FIG. 2.

Subsequently, a heat spreader or a heat conducting lid (e.g., heat spreader 124) is attached to package substrate 122. As an example, heat spreader 124 has a flat surface that may cover IC dies 102 and 104, molding compound 118, and a top surface of package substrate 122. Heat spreader 124 may protect IC dies 102 and 104 from external contaminants and also effectively dissipate heat generated by IC dies 102 and 104 out of the IC package.

Figure 2:
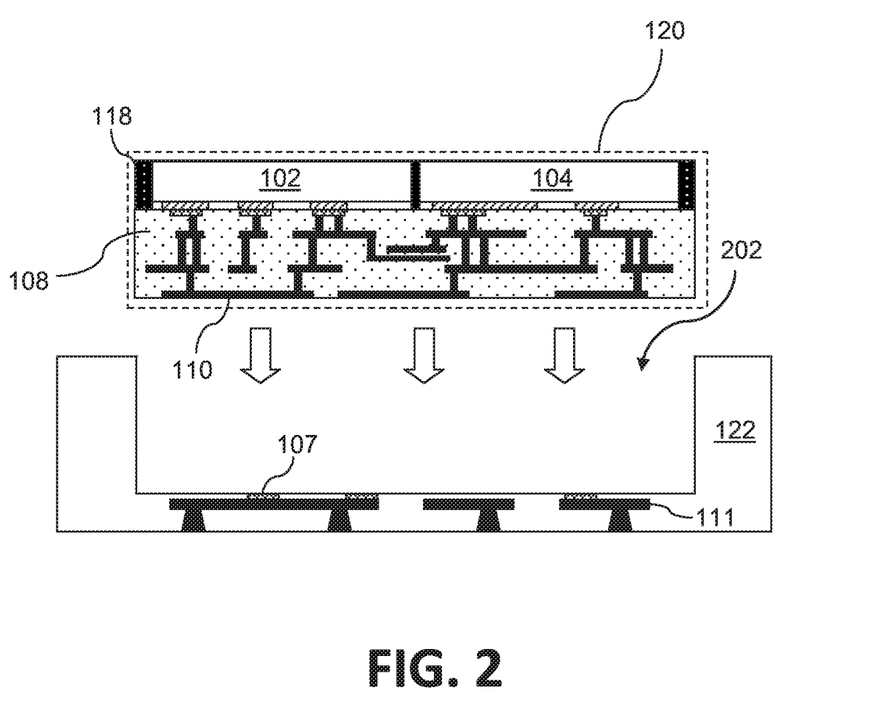
FIG. 2 shows a cross-sectional view of an illustrative package substrate in accordance with one embodiment.

FIG. 2 shows a cross-sectional view of package substrate 122 of FIG. 1 in accordance with one embodiment. In one embodiment, cavity 202 may be formed in package substrate 122. Cavity 202 may be formed in package substrate 122 through a laser drilling process or other cavity-creation methods. As an example, cavity 202 may be an open-structured cavity. The open-structured cavity may incorporate the IC dies 102 and 104, molding compound 118, and interposer substrate 108 (collectively referred to as WLFO structure 120 of FIG. 1), such that a compact and thin IC package is formed. To do so, the back surfaces of IC die 102 and 104 and molding compound 118 may be pressed into cavity 202 so WLFO structure 120 can be fitted within cavity 202 and surrounded by package substrate 122.

In this configuration, a portion of metal traces 110 of interposer substrate 108 may directly contact corresponding conductive pads 107 of package substrate 122 to form electrical connections. In one embodiment, metal traces 110 of interposer substrate 108 are attached to conductive pads 107 in a similar manner as how conductive pads 105 of IC dies 102 and 104 are attached to conductive pads 106 on interposer substrate 108, as described above in FIG. 1. Such a configuration permits closer spacing of IC dies 104 and 106 and interposer substrate 108 to package substrate 102 for minimizing overall package height and obtaining a low-profile package.

Figure 3:
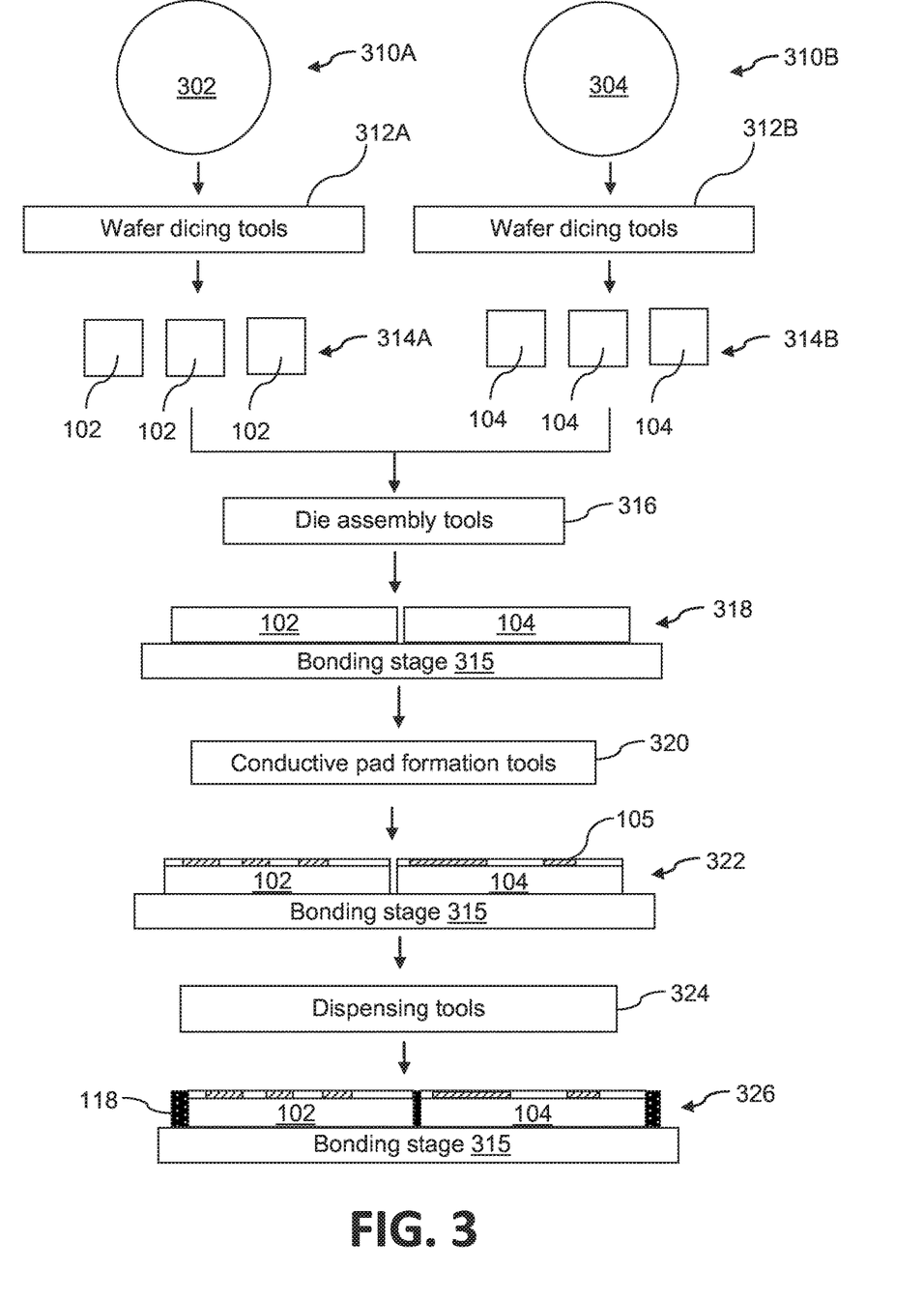
FIG. 3 shows illustrative steps for packaging integrated circuit dies in accordance with one embodiment.

FIG. 3 shows certain illustrative steps for packaging integrated circuit (IC) dies in accordance with one embodiment. As shown in step 310A, semiconductor wafer 302 is singulated (e.g., diced) into individual IC dies 102 (as shown in step 314A) using wafer dicing tools 312A. Similarly, at step 310B, semiconductor wafer 304 is singulated into individual IC dies 104 (as shown in step 314B) using wafer dicing tools 312B. In practice, one or more steps involving the same integrated components may be combined with other steps, performed in any suitable order, performed in parallel (e.g., simultaneously or substantially simultaneously), or removed. For example, the wafer dicing operations involving semiconductor wafers 302 and 304 may be performed in parallel to save time and cost.

At step 318, an individual IC die 102 and an individual IC die 104 are assembled on a bonding stage (e.g., bonding stage 315) using die assembly tools 316. In this step, IC dies 102 and 104 may be assembled in a flip-chip configuration, where the front surfaces (e.g., the active surface) of IC dies 102 and 104 are mounted on bonding stage 315. As an example, an adhesive tape (not shown) may be placed on the bonding stage 315. Integrated circuit dies 102 and 104 are then attached onto the adhesive tape in a suitable position (e.g., adjacent to each other).

At step 322, conductive pads (e.g., conductive pads 105) are formed on each of IC dies 102 and 104. In this step, a group of conductive pads 105 are formed on the front surfaces (e.g., active surface) of the respective IC dies 102 and 104. Conductive pads 105 may be formed by a deposition or plating process using conductive pad formation tools 320. For example, conductive pads 105 may be copper pads.

At step 326, a non-conductive material (e.g., molding compound 118) may be deposited by dispensing tools 324 to surround IC dies 102 and 104. Such an arrangement may protect IC dies 102 and 104 and their electrical connections (not shown) from breakage and hazardous environmental contaminants. For example, molding compound 118 may be any suitable material, and in one embodiment may be composed of a mixture of epoxy resin and ceramic filler material.

Figure 4:
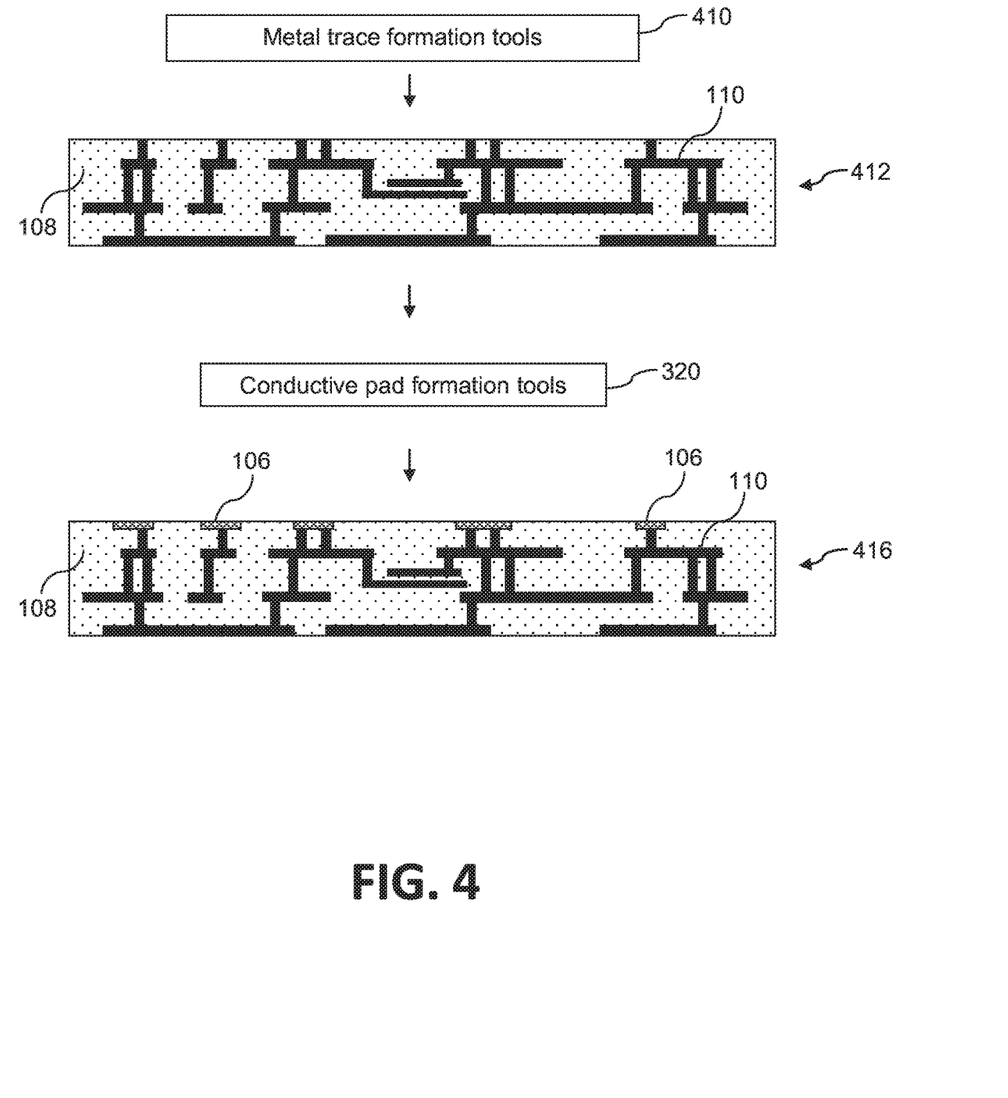
FIG. 4 shows illustrative steps for fabricating an interposer substrate in accordance with one embodiment.

FIG. 4 shows illustrative steps for fabricating an interposer substrate in accordance with one embodiment. At step 412, interconnect pathways such as metal traces 110 are formed in interposer substrate 108. For example, metal traces 110 may be formed through an electroplating process and/or a deposition process using metal trace formation tools 410. Metal traces 110 may form an interconnect structure in interposer substrate 108 that may electrically connect components that are placed on either side of interposer substrate 108. In one embodiment, metal traces 110 may be disposed in a fan-out arrangement to create an intra-package chip-to-chip connection for signal transmissions between two or more electrical components in an IC package.

At step 416, conductive pads (e.g., conductive pads 106) are formed on interposer substrate 108 using conductive pad formation tools 320 of FIG. 3. In this step, a group of conductive pads (e.g., conductive pads 106) are formed on a top surface of interposer substrate 108. For example, conductive pads 106 may be copper pads.

It should be noted that interposer substrate 108 may still be in a whole interposer substrate block (undiced) prior to the formations of the interconnect pathways and conductive pads. Alternatively, interposer substrate 108 may be diced (e.g., using interposer dicing tools) before the formations of the interconnect pathways and conductive pads.

Figure 5:
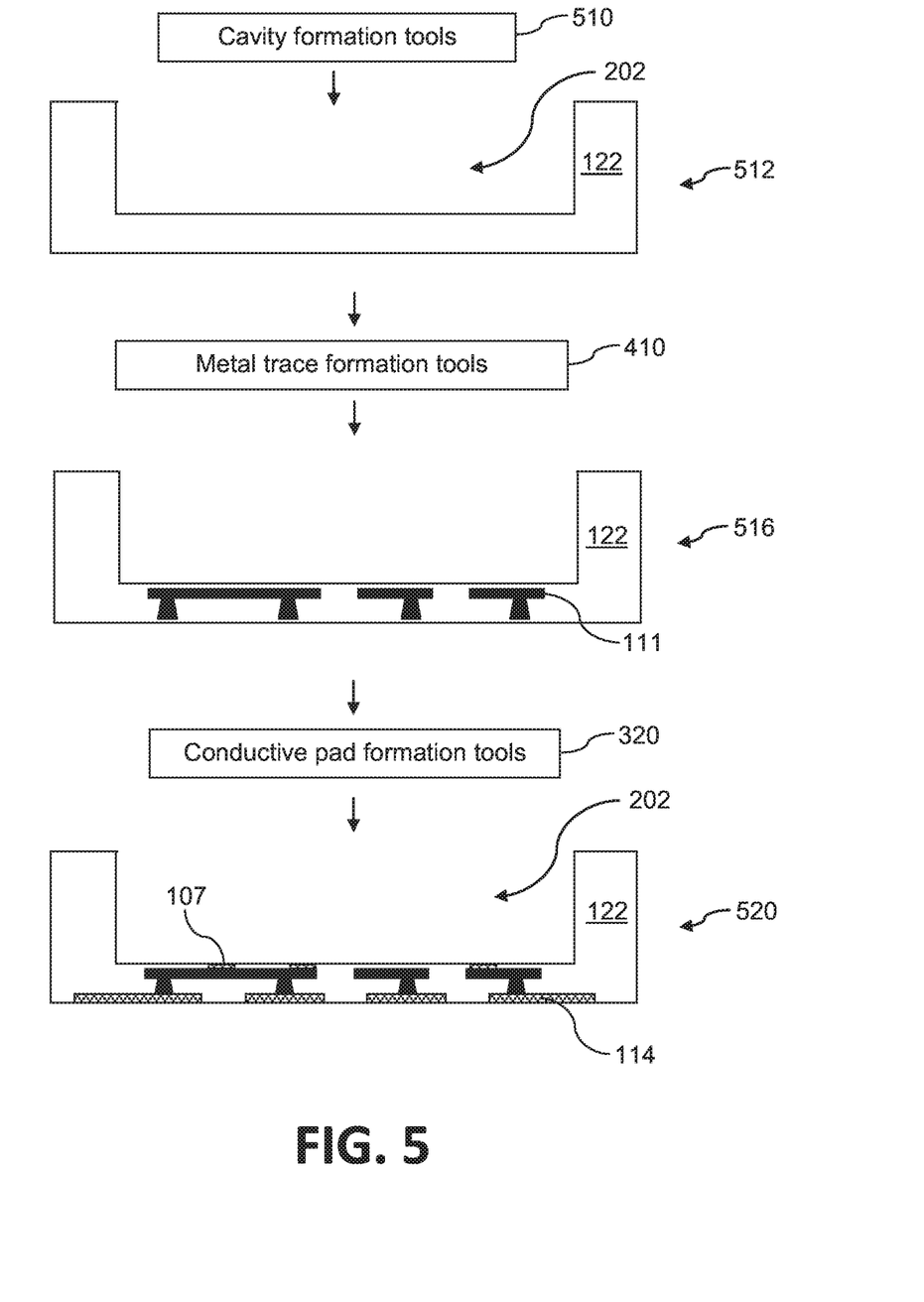
FIG. 5 shows illustrative steps for fabricating a package substrate in accordance with one embodiment.

FIG. 5 shows illustrative steps for assembling an integrated circuit package in accordance with one embodiment. At step 512, a cavity (e.g., cavity 202) is formed in package substrate 122. For example, cavity 202 may be formed through a laser drilling process or other cavity-creation methods using cavity formation tools 510.

At step 516, interconnect pathways such as metal traces 111 are formed in package substrate 122. Similar to metal traces 110 of FIG. 4, metal traces 111 may be formed through an electroplating process and/or a deposition process using metal trace formation tools 410 of FIG. 4. Metal traces 111 may form an interconnect structure in package substrate 122 that may electrically connect components that are placed on either side of package substrate 122. In one embodiment, metal traces 110 may be disposed in a fan-out arrangement to create an intra-package chip-to-chip connection for signal transmissions between two or more electrical components in an IC package.

At step 520, conductive pads such as conductive pads 107 and 114 are formed on package substrate 122 using conductive pad formation tools 320 of FIG. 3. In this step, a group of conductive pads 107 are formed in cavity 202 of package substrate 122. Accordingly, another group of conductive pads 114 is formed on a bottom surface of package substrate 122. For example, conductive pads 106 and 114 may be copper pads.

Figure 6:
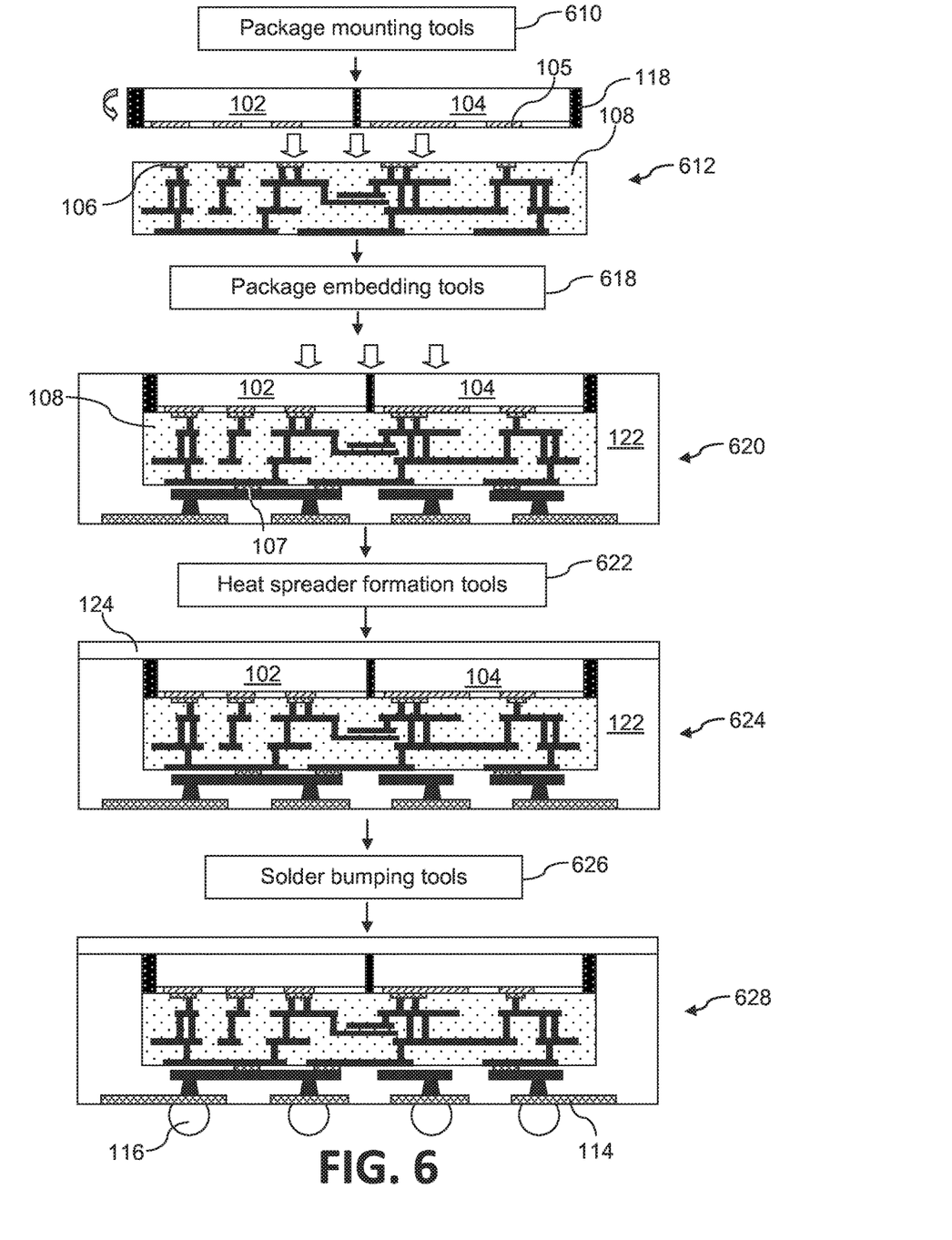
FIG. 6 shows illustrative steps for assembling an integrated circuit package on a package substrate in accordance with one embodiment.

FIG. 6 shows illustrative steps for assembling an integrated circuit package on a package substrate in accordance with one embodiment. At step 612, IC dies 102 and 104, both of which are surrounded by molding compound 118, are attached to interposer substrate 108. In this step, IC dies 102 and 104 may electrically connect to interposer substrate 108 via direct coupling of conductive pads 105 of IC dies 102 and 104 to their respective conductive pads 106 on interposer substrate 108. To do so, each of the conductive pads 105 is physically contacted to the corresponding conductive pads 106 on interposer substrate 108 using package mounting tools 610. For example, package mounting tools 610 may include a bonding tool (not shown) that applies heat and pressure onto the back surfaces (e.g., the inactive surfaces) of IC dies 102 and 104 to facilitate the attachment of IC dies 102 and 104 to interposer substrate 108.

At step 620, interposer substrate 108, molding compound 118, and IC dies 102 and 104 are embedded into package substrate 122 using package embedding tools 618. As an example, package substrate 122 may provide an embedding space (e.g., cavity 202 of FIG. 5) for interposer substrate 108, molding compound 118, and IC dies 102 and 104. In this step, the back surfaces (e.g., inactive surface) of IC dies 102 and 104 and molding compound 118 are pressed into a cavity (e.g., cavity 202 of FIG. 5) of package substrate 102 so that all of interposer substrate 108, molding compound 118, and IC dies 102 and 104 can be embedded into package substrate 122. In this configuration, a portion of metal traces 110 of interposer substrate 108 may directly contact corresponding conductive pads 107 of package substrate 122 to form electrical connections.

At step 624, a heat spreader (e.g., heat spreader 124) is formed to cover IC dies 102 and 104 using heat spreader formation tools 622. In this step, the exposed back surfaces of IC dies 102 and 104 are covered with heat spreader 124 to protect IC dies 102 and 104 from external contaminants, and also to effectively dissipate heat generated by IC dies 102 and 104 out of the IC package.

At step 628, external connectors such as solder balls 116, for example, are formed on a bottom surface of package substrate 122 (via conductive pads 114) using solder bumping tools 626. Such a configuration may provide external electrical connections for IC dies 102 and 104 by way of solder balls 116 to a printed circuit substrate (not shown), which may be populated with other circuits.

Figure 7:
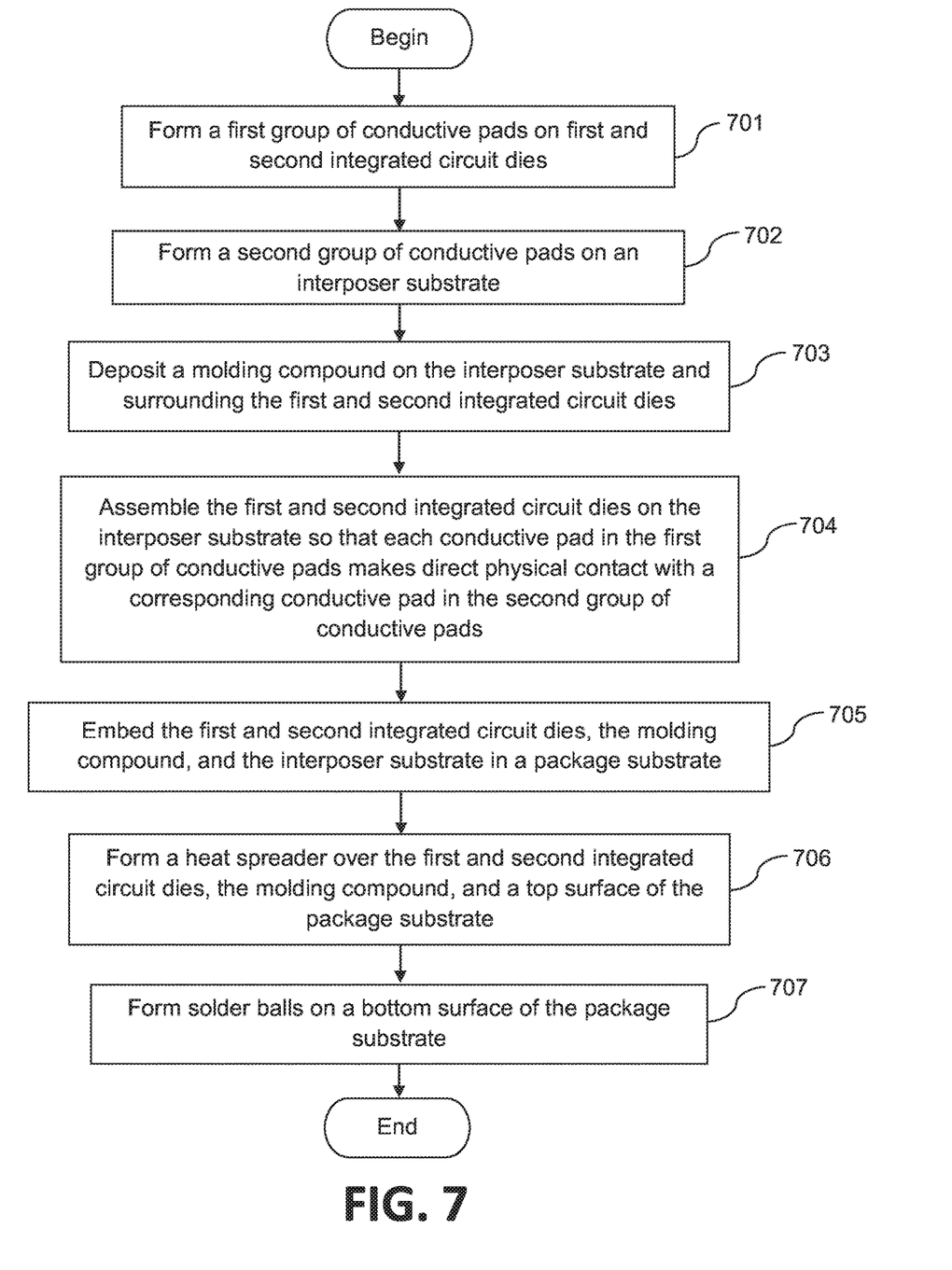
FIG. 7 is a flow chart of illustrative steps to fabricate an integrated circuit package in accordance with one embodiment.

FIG. 7 is a flow chart of illustrative steps to fabricate an integrated circuit package in accordance with one embodiment. It should be appreciated that the embodiments of FIGS. 1-6 may be used as examples to implement the steps described below.

At step 701, a first group of conductive pads is formed on the first and second integrated circuit dies. For example, as shown in FIG. 3, conductive pads 105 are formed on the front surfaces (e.g., active surfaces) of IC dies 102 and 104. Accordingly, a second group of conductive pads is formed on an interposer substrate at step 702. For example, as shown in FIG. 4, conductive pads 106 may be formed on a top surface of interposer substrate 108. The fabrication of conductive pads 105 and 106 may use a conventional manufacturing method, and therefore, is not described in detail in order to not unnecessarily obscure the present disclosure. In one embodiment, conductive pads 106 may be coupled to a group of interconnect pathways (e.g., metal traces 110 of FIG. 1) in interposer substrate 108.

At step 703, a molding compound is deposited on the interposer substrate and surrounding the first and second integrated circuit dies. For example, as shown in FIG. 3, molding compound 118 is formed to surround IC dies 102 and 104. A molding process (e.g., an injection molding process) may be performed to enclose integrated circuit IC dies 102 and 104 within the molding compound 118.

At step 704, the first and second integrated circuit dies are assembled on the interposer substrate so that each conductive pad in the second group of conductive pads makes direct physical contact with a corresponding conductive pad in the first group of conductive pads. For example, as shown in FIG. 6, IC dies 102 and 104 and molding compound 118 are attached to interposer substrate 108. Such a configuration forms an integrated circuit structure similar to wafer-level fan-out (WLFO) structure 120 of FIG. 1. In this step, IC dies 102 and 104 may mechanically and electrically connected to interposer substrate 108 by a thermal compression process, which may be performed on the back surfaces (e.g., inactive surfaces) of IC dies 102 and 104. In this scenario, the front surfaces (e.g., active surfaces) of IC dies 102 and 104 are pressed down onto interposer substrate 108 such that each conductive pad 105 of IC dies 102 and 104 is directly attached to its corresponding conductive pad 106 on interposer substrate 108.

At step 705, the first and second integrated circuit dies, the molding compound, and the interposer substrate are embedded in a package substrate. For example, as shown in FIG. 2, the back surfaces of IC die 102 and 104 and molding compound 118 may be pressed so that they can be fitted into cavity 202 and surrounded by package substrate 102. In this configuration, a portion of metal traces 110 of interposer substrate 108 may directly contact corresponding conductive pads 107 of package substrate 122 to form electrical connection. Such a configuration may reduce the thickness of the mounted IC dies 104 and 106 and interposer substrate 108 on package substrate 102, which subsequently reduces the overall height of the IC package.

At step 706, a heat spreader is formed over the first and second integrated circuit dies, the molding compound, and a top surface of package substrate. For example, as shown in FIG. 1, heat spreader 124 is formed over IC dies 102 and 104, molding compound 118, and the top surface of package substrate 122. Heat spreader 124 may dissipate heat from the IC dies 102 and 104, as well as protect IC dies 102 and 104 from external contaminants.

At step 707, solder balls are formed on a bottom surface of the package substrate. For example, as shown in FIG. 1, solder balls 116 may be disposed on conductive pads 114 on the bottom surface of package substrate 122. Solder balls 116 may provide electrical communication from IC package 100 to a printed circuit substrate (not shown), which may also host other circuits.

The methods and apparatuses described herein may be incorporated into any suitable circuit. For example, the methods and apparatuses may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

What is claimed is:

1. An integrated circuit package comprising:
    an interposer substrate;
    a first conductive pad on the interposer substrate;
    a second conductive pad formed on a front surface of an integrated circuit die, wherein the second conductive pad directly contacts the first conductive pad on the interposer substrate; and
    a continuous package substrate having a cavity defined by a continuous wall comprising substantially the same material, wherein the interposer substrate and the integrated circuit die are disposed in the cavity.

2. The integrated circuit package defined in claim 1, wherein each of the first and second conductive pads comprises a copper pad.

3. The integrated circuit package defined in claim 1, comprising:
    interconnect pathways that are formed in the interposer substrate and that are electrically coupled to the first and second conductive pads.

4. The integrated circuit package defined in claim 3, wherein the interconnect pathways comprise copper traces.

5. The integrated circuit package defined in claim 1, wherein the front surface of the integrated circuit die serves as an active surface of the integrated circuit die in which transistors are formed.

6. The integrated circuit package defined in claim 1, wherein the package substrate comprises an organic substrate.

7. The integrated circuit package defined in claim 1, comprising:
    a heat spreader formed over the integrated circuit die and the package substrate.

8. The integrated circuit package defined in claim 7, wherein the heat spreader comprises a flat heat spreader.

9. An integrated circuit package, comprising:
    an interposer substrate having a surface, the interposer substrate having a plurality of conductive pads on the surface;
    an integrated circuit die having front and back surfaces, wherein the integrated circuit die is mounted on the interposer substrate, and wherein the front surface of the integrated circuit die faces the interposer substrate;
    a plurality of contact pads formed on the front surface of the integrated circuit die, each of which makes direct physical contact with a corresponding conductive pad in the plurality of conductive pads; and
    a continuous package substrate having a continuous wall comprising substantially the same material that surrounds the interposer substrate and the integrated circuit die.

10. The integrated circuit package defined in claim 9, comprising:
    a plurality of interconnect pathways in the interposer substrate, each of which is coupled to a corresponding conductive pad of the plurality of conductive pads.

11. The integrated circuit package defined in claim 10, comprising:
    an additional integrated circuit die that is mounted on the interposer substrate and that is coupled to the integrated circuit die through the plurality of interconnect pathways of the interposer substrate.

12. The integrated circuit package defined in claim 10, wherein the plurality of interconnect pathways is disposed in a fan-out arrangement.

13. The integrated circuit package defined in claim 9, wherein the package substrate has top and bottom surfaces, and wherein the integrated circuit package comprises:
 a heat spreader disposed over the back surface of the integrated circuit die on the top surface of the package substrate.

14. The integrated circuit package defined in claim 13, comprising:
 a molding compound formed between the interposer substrate and the heat spreader and surrounding the integrated circuit die.

15. The integrated circuit package defined in claim 9, wherein the package substrate has top and bottom surfaces, and wherein the integrated circuit package comprises:
 a molding compound formed between the interposer substrate and the heat spreader and surrounding the integrated circuit die.

16. A method of fabricating an integrated circuit package, comprising:
 forming a first plurality of conductive pads on an interposer substrate;
 forming a second plurality of conductive pads on an integrated circuit die;
 assembling the integrated circuit die on the interposer substrate so that each conductive pad in the second plurality of conductive pads makes direct physical contact with a corresponding conductive pad in the first plurality of conductive pads; and
 embedding the integrated circuit die and the interposer substrate in a continuous package substrate to form the integrated circuit package, wherein the integrated circuit die and the interposer are surrounded by a continuous wall of the continuous package substrate, comprising substantially the same material.

17. The method defined in claim 16, comprising:
 forming a plurality of interconnect pathways in the interposer substrate, each of which is coupled to a corresponding conductive pad of the second plurality of conductive pads.

18. The method defined in claim 17, comprising:
 assembling an additional integrated circuit die on the interposer substrate, wherein the additional integrated circuit is coupled to the integrated circuit die through the plurality of interconnect pathways.

19. The method defined in claim 16, comprising:
 forming a heat spreader on the integrated circuit package.

20. The method defined in claim 19, comprising:
 depositing a molding compound between the interposer substrate and the heat spreader and surrounding the integrated circuit die.

\* \* \* \* \*